United States Patent
Chen et al.

(10) Patent No.: US 10,833,010 B2
(45) Date of Patent: Nov. 10, 2020

(54) INTEGRATION OF ARTIFICIAL INTELLIGENCE DEVICES

(71) Applicant: International Business Machines Corporation, Armonk, NY (US)

(72) Inventors: Hsueh-Chung Chen, Cohoes, NY (US); Lawrence A. Clevenger, Saratoga Springs, NY (US); Fee Li Lie, Albany, NY (US); Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/176,355

(22) Filed: Oct. 31, 2018

(65) Prior Publication Data
US 2020/0135635 A1   Apr. 30, 2020

(51) Int. Cl.
*H01L 23/528* (2006.01)
*H01L 23/532* (2006.01)
(Continued)

(52) U.S. Cl.
CPC ............ *H01L 23/528* (2013.01); *G06N 5/02* (2013.01); *H01L 21/76807* (2013.01);
(Continued)

(58) Field of Classification Search
CPC ............... H01L 23/758; H01L 23/5226; H01L 23/53228; H01L 23/53257;
(Continued)

(56) References Cited

U.S. PATENT DOCUMENTS 6,900,517 B2  5/2005  Tanaka et al.
7,254,059 B2  8/2007  Li et al.
(Continued)

FOREIGN PATENT DOCUMENTS

WO   2010051010 A1   5/2010

OTHER PUBLICATIONS

Burr, et al., "Overview of candidate device technologies for storage-class memory," IBM J. Res. & Dev. vol. 52 No. 4/5 Jul./Sep. 2008, 16 pages.
(Continued)

*Primary Examiner* — Timor Karimy
(74) *Attorney, Agent, or Firm* — Amin, Turocy & Watson, LLP

(57) ABSTRACT

Techniques that facilitate integration of artificial intelligence devices are provided. In one example, a device includes a first dual-damascene layer, a second dual-damascene layer and an artificial intelligence memory device. The first dual-damascene layer comprises a first set of copper connections formed in first dielectric material. The second dual-damascene layer that comprises a second set of copper connections formed in second dielectric material. The artificial intelligence memory device is integrated between the first dual-damascene layer and the second dual-damascene layer. A through-level via (TLV) electrical connection associated with the artificial intelligence memory device provides an interconnection between the first set of copper connections and the second set of copper connections.

13 Claims, 15 Drawing Sheets

(51) Int. Cl.
*H01L 27/24* (2006.01)
*H01L 43/12* (2006.01)
*H01L 27/22* (2006.01)
*H01L 45/00* (2006.01)
*H01L 21/768* (2006.01)
*H01L 43/02* (2006.01)
*G06N 5/02* (2006.01)
*H01L 23/522* (2006.01)

(52) U.S. Cl.
CPC .. *H01L 21/76829* (2013.01); *H01L 21/76895* (2013.01); *H01L 23/5226* (2013.01); *H01L 23/53228* (2013.01); *H01L 23/53257* (2013.01); *H01L 27/222* (2013.01); *H01L 27/2463* (2013.01); *H01L 43/02* (2013.01); *H01L 43/12* (2013.01); *H01L 45/06* (2013.01); *H01L 45/1233* (2013.01); *H01L 45/1683* (2013.01); *H01L 45/144* (2013.01)

(58) Field of Classification Search
CPC ......... H01L 21/76807; H01L 21/76829; H01L 21/76895; H01L 27/222; H01L 27/2463; H01L 43/02; H01L 43/12; H01L 45/06; H01L 45/1233; H01L 45/1683; H01L 45/144; G06N 5/02
See application file for complete search history.

(56) References Cited

U.S. PATENT DOCUMENTS

| | | | |
|---|---|---|---|
| 7,688,619 B2 | 3/2010 | Lung et al. | |
| 8,173,987 B2 | 5/2012 | Lung | |
| 8,461,692 B2 | 6/2013 | Rhodes | |
| 8,860,188 B2 | 10/2014 | Woo | |
| 8,927,413 B2 | 1/2015 | Huang et al. | |
| 9,330,974 B2 | 5/2016 | Kim et al. | |
| 9,646,882 B2 | 5/2017 | Zhu | |
| 2010/0289098 A1* | 11/2010 | Li | H01L 43/02 257/421 |
| 2012/0032287 A1* | 2/2012 | Li | H01L 43/08 257/421 |

OTHER PUBLICATIONS

Burr, et al., "Recent Progress in Phase-Change Memory Technology," IEEE Journal on Emerging and Selected Topics in Circuits and Systems, 2016, 17 pages.

Monnig, "The transition to Cu, damascene and low-K dielectrics for integrated circuit interconnects, impacts on the industry," Characterization and Metrology for ULSI Technology: 2000 International Conference, 9 pages.

Vermij, et al., "An Architecture for Near-Data Processing Systems," CF'16 May 16-19, 2016, Como, Italy, 4 pages.

* cited by examiner

FROM FIG. 5

FROM FIG. 6

FROM FIG. 8

FROM FIG. 13

INTEGRATION OF ARTIFICIAL INTELLIGENCE DEVICES

BACKGROUND

The subject disclosure relates to silicon technologies, and more specifically, to architecture for artificial intelligence systems.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatuses and/or devices that provide for integration of artificial intelligence devices are described.

According to an embodiment, a device can comprise a first dual-damascene layer, a second dual-damascene layer and an artificial intelligence memory device. The first dual-damascene layer can comprise a first set of copper connections formed in first dielectric material. The second dual-damascene layer can comprise a second set of copper connections formed in second dielectric material. The artificial intelligence memory device can be integrated between the first dual-damascene layer and the second dual-damascene layer. A through-level via (TLV) electrical connection associated with the artificial intelligence memory device can provide an interconnection between the first set of copper connections and the second set of copper connections.

According to another embodiment, a method is provided. The method can comprise forming a first dual-damascene layer that comprises a first set of copper connections formed in first dielectric material. The method can also comprise forming an artificial intelligence device layer on the first dual-damascene layer. Additionally, the method can comprise forming, on the artificial intelligence device layer, a second dual-damascene layer that comprises a second set of copper connections formed in second dielectric material, where a through-level via (TLV) electrical connection associated with the artificial intelligence device layer provides an interconnection between the first set of copper connections and the second set of copper connections.

According to yet another embodiment, a device can comprise a first dual-damascene layer, a second dual-damascene layer and an artificial intelligence device layer. The first dual-damascene layer can comprise a first set of copper connections formed in first dielectric material. The second dual-damascene layer can comprise a second set of copper connections formed in second dielectric material. The artificial intelligence device layer can be integrated between the first dual-damascene layer and the second dual-damascene layer. The artificial intelligence device layer can comprise an artificial intelligence memory device and a through-level via (TLV) electrical connection that provides an interconnection between the first set of copper connections and the second set of copper connections.

DETAILED DESCRIPTION

Figure 1:
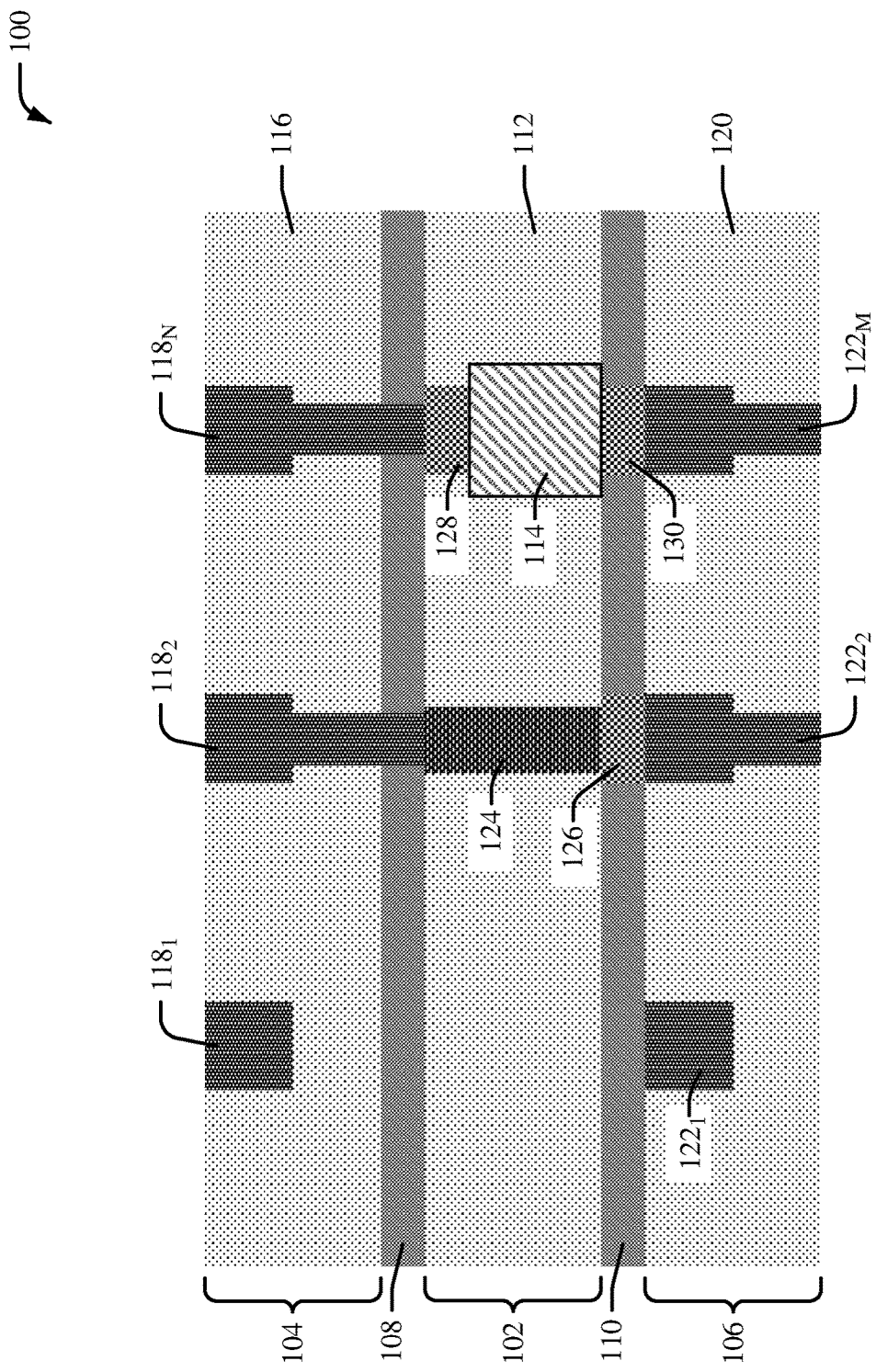
FIG. 1 illustrates an example, non-limiting device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Artificial intelligence techniques are generally computationally intensive. As such, it is generally desirable to reduce access time to a memory employed by an artificial intelligence technique. In one example, storage class memory can be employed in an artificial intelligence computer architecture. In another example, processor-in-memory can be employed by an artificial intelligence computer architecture. In yet another example, phase-change memory can be employed by an artificial intelligence computer architecture. However, it is generally difficult to integrate storage class memory, processor-in-memory, phase-change memory and/or other memory into an artificial intelligence computer architecture. For instance, it is generally difficult to integrate storage class memory, processor-in-memory, phase-change memory and/or other memory into a complementary metal-oxide-semiconductor process associated with an artificial intelligence computer architecture. As such, integration of memory and/or an artificial intelligence device in an artificial intelligence computer architecture can be improved.

Embodiments described herein include systems, methods, apparatuses and devices that provide for integration of artificial intelligence devices. For example, a novel artificial intelligence computer architecture structure and/or novel artificial intelligence computer architecture fabrication techniques is disclosed herein to provide improved access time to a memory employed by an artificial intelligence technique as compared to conventional artificial intelligence computer architectures. In an embodiment, an artificial intelligence device level can be implemented between a first dual-damascene interconnect and a second dual-damascene interconnect. The first dual-damascene interconnect can be a first dual-damascene layer that includes a first set of copper connections formed in a first dielectric material. The second dual-damascene interconnect can be a second dual-damascene layer that includes a second set of copper connections formed in a second dielectric material. The artificial intelligence device level can be an artificial intelligence device layer that includes oxide material and an artificial intelligence device. The artificial intelligence device can be, for example, an artificial intelligence memory device. For example, the artificial intelligence device can be a resistive random-access memory device, a magnetoresistive random-access memory device, a phase-change memory device, or another memory device. In an aspect, a through-level via (TLV) electrical connection associated with the artificial intelligence device can provide an interconnection between the first set of copper connections and the second set of copper connections. For example, the TLV electrical connection can pass through the artificial intelligence device layer to form an interconnect between the first set of copper connections and the second set of copper connections. The TLV electrical connection can include tungsten, copper, titanium nitride or another metal. In another aspect, the artificial intelligence device can be connected to the first dual-damascene interconnect and the second dual-damascene interconnect using at least one landing pad. The at least one landing pad can include tungsten, copper, titanium nitride or another metal. In certain embodiments, the at least one landing pad can be a first material that is different than a second material of the TLV electrical connection. As such, access time to a memory employed by an artificial intelligence technique can be improved. For instance, access time to the artificial intelligence device can be improved. Furthermore, an artificial intelligence device can be efficiently integrated into a complementary metal-oxide-semiconductor process. Additionally, an independent artificial intelligence device layer can be achieved in an artificial intelligence computer architecture. Moreover, performance of an artificial intelligence device and/or a process associated with an artificial intelligence process can be improved.

FIG. 1 illustrates a cross-sectional side view of an example, non-limiting device 100 in accordance with one or more embodiments described herein. The device 100 can be, for example, an artificial intelligence interconnect structure. The device 100 can include an artificial intelligence device layer 102, a dual-damascene layer 104 and a dual-damascene layer 106. The artificial intelligence device layer 102 can be implemented between the dual-damascene layer 104 and the dual-damascene layer 106. In certain embodiments, a dielectric layer 108 can be deposited between the artificial intelligence device layer 102 and the dual-damascene layer 104. Additionally or alternatively, in certain embodiments, a dielectric layer 110 can be deposited between the artificial intelligence device layer 102 and the dual-damascene layer 106.

The artificial intelligence device layer 102 can include oxide material 112 and an artificial intelligence device 114. The artificial intelligence device 114 can be a device employed during an artificial intelligence process. In an embodiment, the artificial intelligence device 114 can be an artificial intelligence memory device that stores data associated with an artificial intelligence process. For example, the artificial intelligence device 114 can be a resistive random-access memory device, a magnetoresistive random-access memory device, a phase-change memory device, or another memory device. In a non-liming example, the artificial intelligence device 114 can be a phase-change memory that comprises altering phases between a top electrode a bottom electrode. For example, an amorphous state associated with a disordered structure and/or high resistance between a top electrode a bottom electrode of the phase-change memory can represent a first bit value. Furthermore, a crystalline state associated with an ordered structure and/or a low resistance between a top electrode a bottom electrode of the phase-change memory can represent a second bit value.

The dual-damascene layer 104 can include dielectric material 116. A set of copper connections $118_{1-N}$ can be formed in the dielectric material 116 of the dual-damascene layer 104, where N is an integer. In an aspect, the set of copper connections $118_{1-N}$ can be a set of trenches in the dielectric material 116 filled with copper. The dual-damascene layer 106 can include dielectric material 120. A set of copper connections $122_{1-M}$ can be formed in the dielectric material 120 of the dual-damascene layer 106, where M is an integer. In an aspect, the set of copper connections $122_{1-M}$ can be a set of trenches in the dielectric material 120 filled with copper. In an embodiment, a through-level via (TLV) electrical connection 124 can provide an interconnection between the set of copper connections $118_{1-N}$ and the set of copper connections $122_{1-M}$. The TLV electrical connection 124 can pass through the artificial intelligence device layer 102. For instance, the TLV electrical connection 124 can pass through the oxide material 112 of the artificial intelligence device layer 102. The TLV electrical connection 124 can include tungsten, copper, titanium nitride or another metal. In certain embodiments, the TLV electrical connection 124 can additionally pass through at least a portion of the dielectric layer 108 and/or the dielectric layer 110. In an example, the TLV electrical connection 124 can provide an interconnect between the copper connection $118_2$ of the set of copper connections $118_{1-N}$ and the copper connection $122_2$ of the set of copper connections $122_{1-M}$. The oxide material 112 can include an oxide that is an electrical insulator. The dielectric material 116 and the oxide material 112 can include a dielectric that is an electrical insulator. In an embodiment, the oxide material 112 can be different than the oxide material 112 and/or the dielectric material 116. In another embodiment, the oxide material 112 can correspond to the oxide material 112 and/or the dielectric material 116. The dielectric layer 108 and/or the dielectric layer 108 can include a dielectric material that is an electrical insulator. In one example, the dielectric layer 108 and/or the dielectric layer 108 can be a dielectric cap layer. In an embodiment, dielectric material of the dielectric layer 108 and/or the dielectric layer 108 can be different than the oxide material 112, the oxide material 112 and/or the dielectric material 116. In another embodiment, dielectric material of the dielectric layer 108 and/or the dielectric layer 108 can correspond to the oxide material 112, the oxide material 112 and/or the dielectric material 116.

In certain embodiments, a landing pad layer 126 can be integrated between the TLV electrical connection 124 and the set of copper connections $122_{1-M}$. For example, the landing pad layer 126 can be integrated between the TLV electrical connection 124 and the copper connection $122_2$ of the set of copper connections $122_{1-M}$. The landing pad layer 126 can be a metal connection that includes tungsten, copper, titanium nitride or another metal. Additionally or alternatively, in certain embodiments, a landing pad layer 128 can be integrated between the artificial intelligence device 114 and the set of copper connections $118_{1-N}$. For example, the landing pad layer 128 can be integrated between the artificial intelligence device 114 and the copper connection $128_N$ of the set of copper connections $118_{1-N}$. The landing pad layer 128 can be a metal connection that includes tungsten, copper, titanium nitride or another metal. Additionally or alternatively, in certain embodiments, a landing pad layer 128 can be integrated between the artificial intelligence device 114 and the set of copper connections $118_{1-N}$. For example, the landing pad layer 128 can be integrated between the artificial intelligence device 114 and the copper connection $128_N$ of the set of copper connections $118_{1-N}$. The landing pad layer 128 can be a metal connection that includes tungsten, copper, titanium nitride or another metal. In an embodiment, a material of the landing pad layer 126, the landing pad layer 128 and/or the landing pad layer 130 can be different than a material of the TLV electrical connection 124. In another embodiment, a material of the landing pad layer 126, the landing pad layer 128 and/or the landing pad layer 130 can correspond to a material of the TLV electrical connection 124. In certain embodiments, a size of the landing pad layer 128 can correspond to a size of the landing pad layer 130. Additionally or alternatively, in certain embodiments, a size of the landing pad layer 128 can be different than a size of the landing pad layer 128 and/or the landing pad layer 130. In a non-limiting example, a height of the landing pad layer 126 and/or the landing pad layer 130 can be between 20 nm and 80 nm. In another non-limiting example, a height of the landing pad layer 128 can be between 100 nm and 300 nm. In yet another non-limiting example, a length of the TLV electrical connection 124 can be between 260 nm and 515 nm.

FIGS. 2-9 pictorially depict an example process 200 for fabricating a device in accordance with one or more embodiments described herein. Repetitive description of like elements employed in other embodiments described herein is omitted for sake of brevity. With reference to FIGS. 2-9, presented is a cross-sectional side view of an intermediate structure 202, an intermediate structure 212, an intermediate structure 301, an intermediate structure 312, an intermediate structure 402, an intermediate structure 412, an intermediate structure 501, an intermediate structure 602, an intermediate structure 612, an intermediate structure 702, an intermediate structure 802, and a structure 902.

Figure 2:
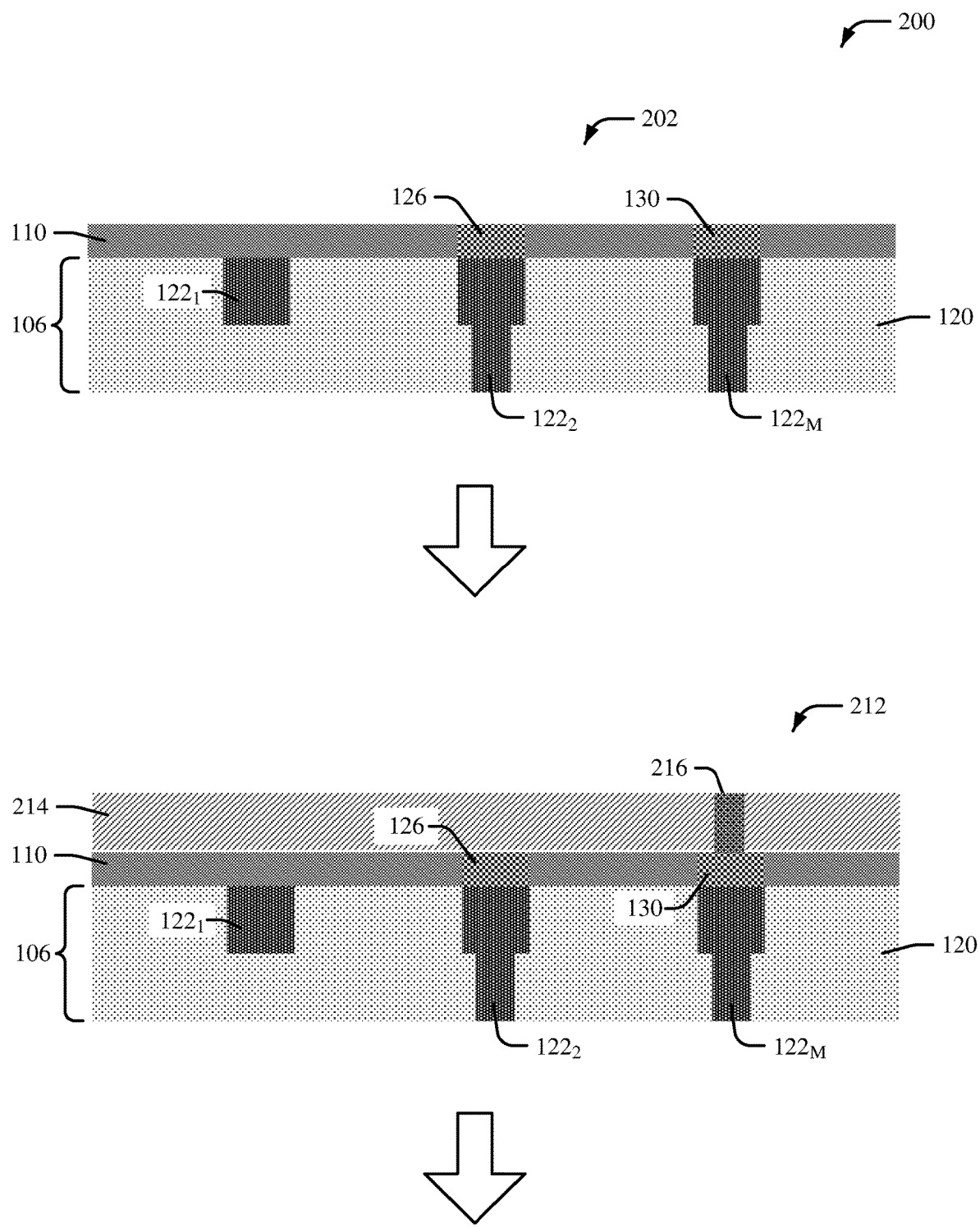
FIG. 2 illustrates an example, non-limiting fabrication process associated with intermediate structures in accordance with one or more embodiments described herein.

Referring to FIG. 2, the intermediate structure 202 can include the dual-damascene layer 106 and the dielectric layer 110, in accordance with one or more embodiments described herein. Repetitive description of like elements employed in other embodiments described herein is omitted for sake of brevity. In an aspect, the set of copper connections $122_{1-M}$ can be formed in the dielectric material 120 of the dual-damascene layer 106. The set of copper connections $122_{1-M}$ can be, for example, a set of trenches in the dielectric material 120 filled with copper. For instance, a set of trenches corresponding to a location of the set of copper connections $122_{1-M}$ can be patterned in the dielectric material 120. Furthermore, the set of trenches can be filled with copper to form the set of copper connections $122_{1-M}$. Additionally, the landing pad layer 126 and/or the landing pad layer 130 can be deposited on at least a portion of the set of copper connections $122_{1-M}$. For instance, the landing pad layer 126 can be deposited on the copper connect $122_2$ and the landing pad layer 130 can be deposited on the copper connect $122_M$. In a non-limiting example, the landing pad layer 126 and/or the landing pad layer 130 can be a tungsten pad. However, it is to be appreciated that, in certain embodiments, the landing pad layer 126 and/or the landing pad layer 130 can be a different type of landing pad such as a copper pad, titanium nitride pad or another type of metal pad. In an embodiment, the artificial intelligence device 114 can be integrated between the dual-damascene layer 104 and the dual-damascene layer 106 to reduce access time to store data to the artificial intelligence device 114. For example, an amount of time to transmit data to the artificial intelligence device 114 and/or retrieve data from the artificial intelligence device 114 can be reduced by integrating the artificial intelligence device 114 between the dual-damascene layer 104 and the dual-damascene layer 106.

Referring further to FIG. 2, the intermediate structure 212 can include the dual-damascene layer 106, the dielectric layer 110 and a silicon nitride layer 214, in accordance with one or more embodiments described herein. Repetitive description of like elements employed in other embodiments described herein is omitted for sake of brevity. The silicon nitride layer 214 can include silicon nitride. Furthermore, the silicon nitride layer 214 can be deposited on the dielectric layer 110. In an aspect, a heater 216 can be formed in the silicon nitride layer 214. The heater 216 can be attached, for example, to the landing pad layer 130. The heater 216 can include, for example, titanium nitride and/or atomic layer deposited tantalum nitride. In a non-limiting example, a height of the heater 216 can be approximately 55 nm.

Figure 3:
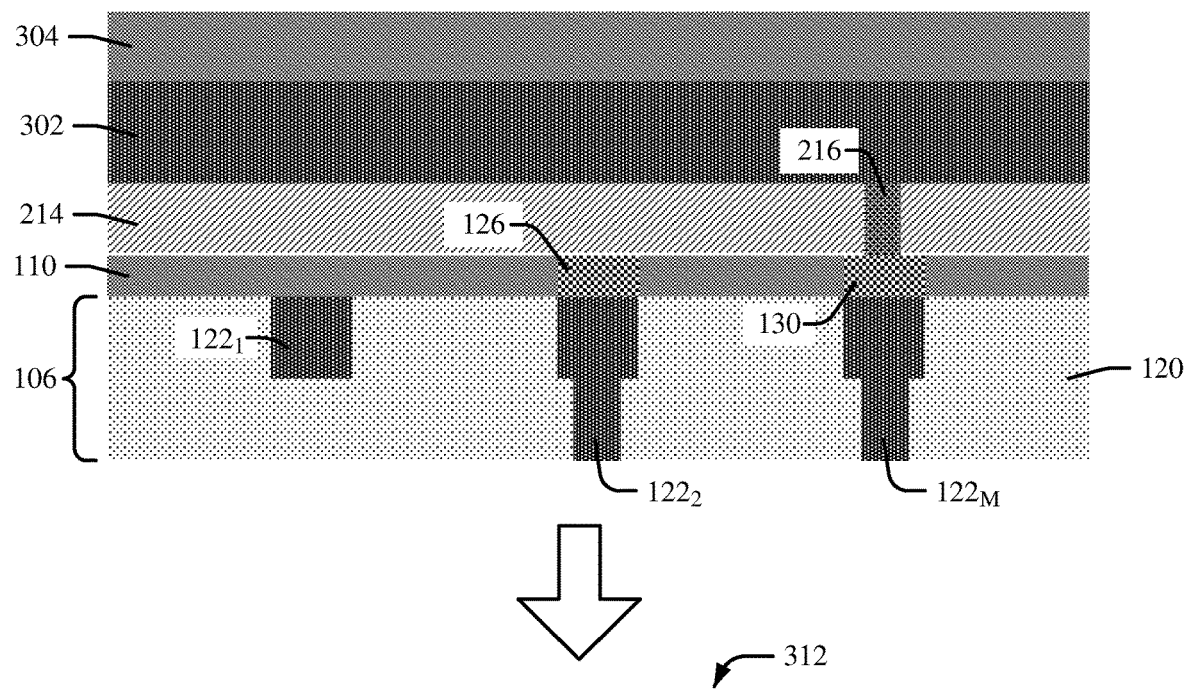
FIG. 3 further illustrates the example, non-limiting fabrication process associated with intermediate structures in accordance with one or more embodiments described herein.
Figure 3:
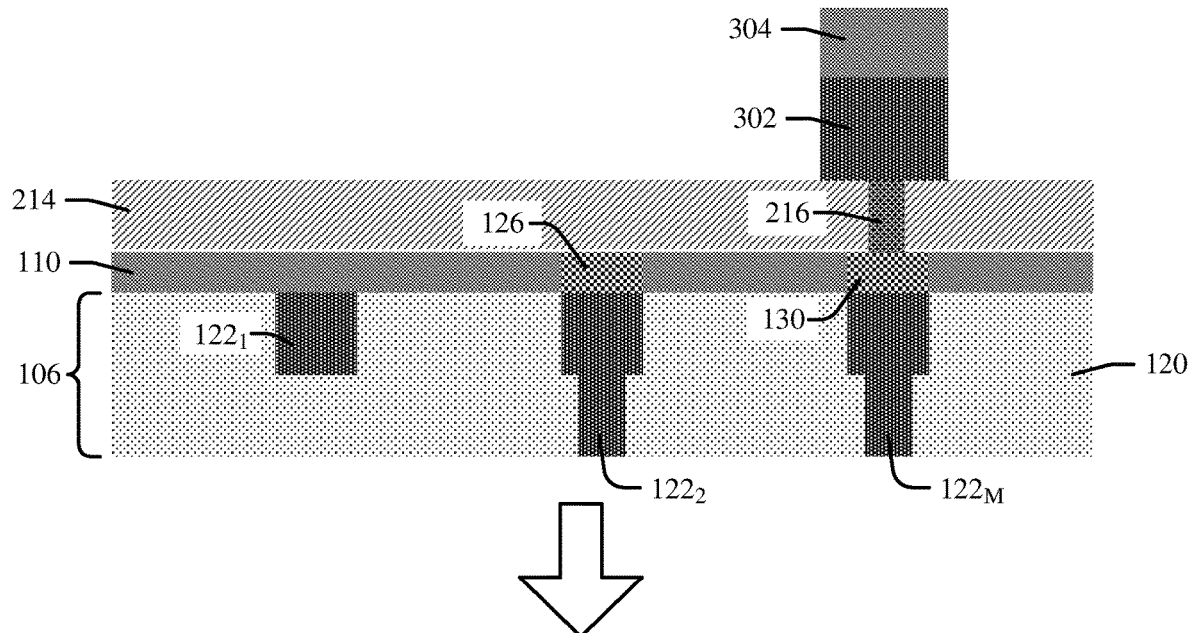

Referring to FIG. 3, the intermediate structure 301 can include the dual-damascene layer 106, the dielectric layer 110, the silicon nitride layer 214, a germanium-antimony-tellurium (GST) layer 302 and a titanium nitride telluride layer 304, in accordance with one or more embodiments described herein. Repetitive description of like elements employed in other embodiments described herein is omitted for sake of brevity. The GST layer 302 can include germanium-antimony-tellurium and can be deposited on the silicon nitride layer 214. The titanium nitride telluride layer 304 can include titanium nitride telluride and can be deposited on the GST layer 302. In a non-limiting example, a height of the GST layer 302 can be between 50 nm and 90 nm. In another non-limiting example, a height of the titanium nitride telluride layer 304 can be between 50 nm and 70 nm.

Referring further to FIG. 3, the intermediate structure 312 can include the dual-damascene layer 106, the dielectric layer 110, the silicon nitride layer 214, the GST layer 302 and the titanium nitride telluride layer 304, in accordance with one or more embodiments described herein. Repetitive description of like elements employed in other embodiments described herein is omitted for sake of brevity. The GST layer 302 and the titanium nitride telluride layer 304 can be etched to a smaller size. For example, a portion of the GST layer 302 and the titanium nitride telluride layer 304 can be etched. A size of the GST layer 302 and the titanium nitride telluride layer 304 can be approximately equal to a size of an area associated with the copper connection $122_M$. In an aspect, the GST layer 302 can be attached to the heater 216 and/or the silicon nitride layer 214.

Figure 4:
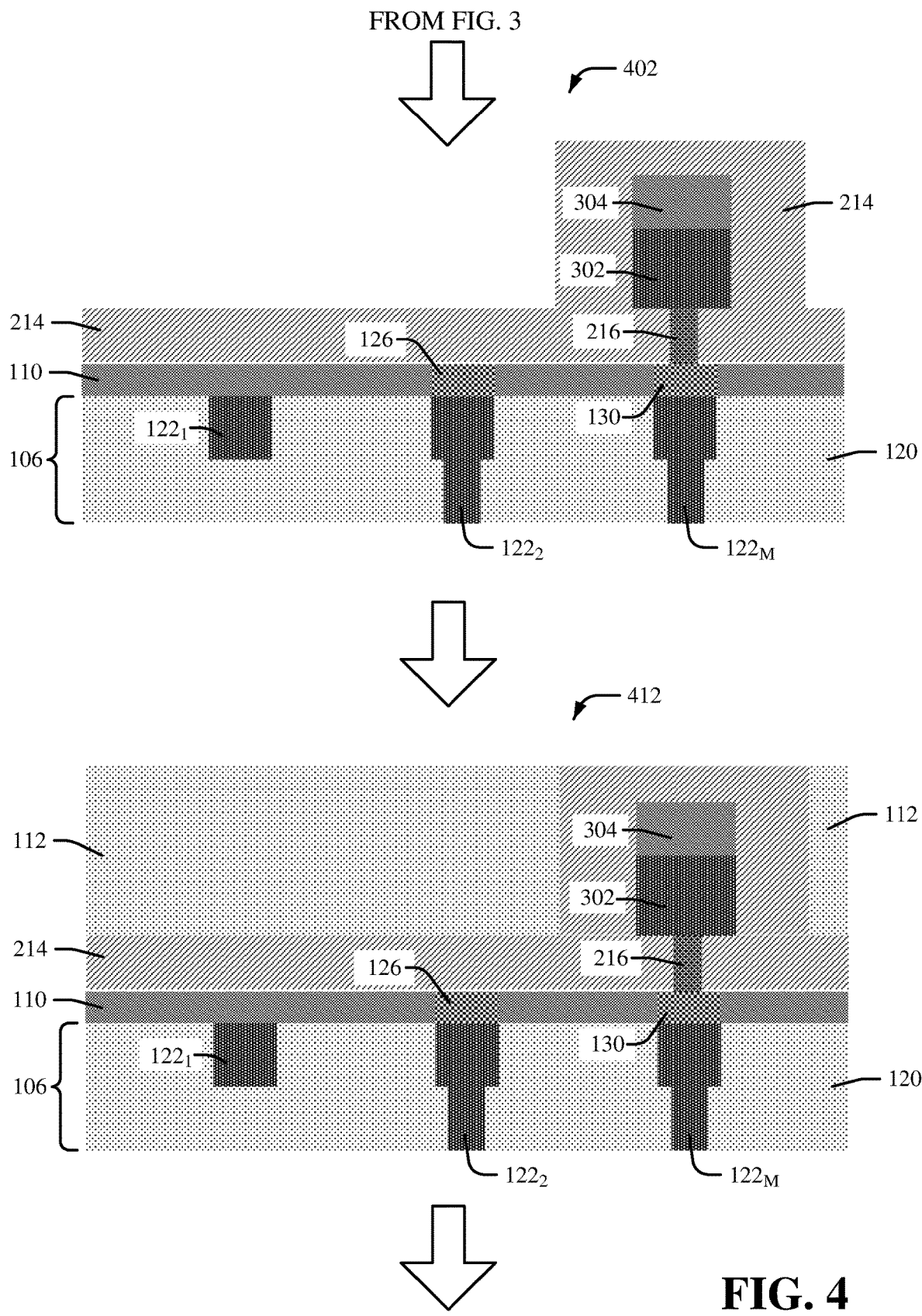
FIG. 4 further illustrates the example, non-limiting fabrication process associated with intermediate structures in accordance with one or more embodiments described herein.

Referring now to FIG. 4, the intermediate structure 402 can include the dual-damascene layer 106, the dielectric layer 110, the silicon nitride layer 214, the GST layer 302 and the titanium nitride telluride layer 304, in accordance with one or more embodiments described herein. Repetitive description of like elements employed in other embodiments described herein is omitted for sake of brevity. In an aspect, the silicon nitride layer 214 can be further deposited to provide a silicon nitride cap around the GST layer 302 and the titanium nitride telluride layer 304. For example, the silicon nitride layer 214 can be expanded such that the GST layer 302 and the titanium nitride telluride layer 304 is surrounded by the silicon nitride layer 214.

Referring further to FIG. 4, the intermediate structure 412 can include the dual-damascene layer 106, the dielectric layer 110, the silicon nitride layer 214, the GST layer 302, the titanium nitride telluride layer 304 and the oxide material 112, in accordance with one or more embodiments described herein. Repetitive description of like elements employed in other embodiments described herein is omitted for sake of brevity. In an aspect, the oxide material 112 can be deposited on the silicon nitride layer 214.

Figure 5:
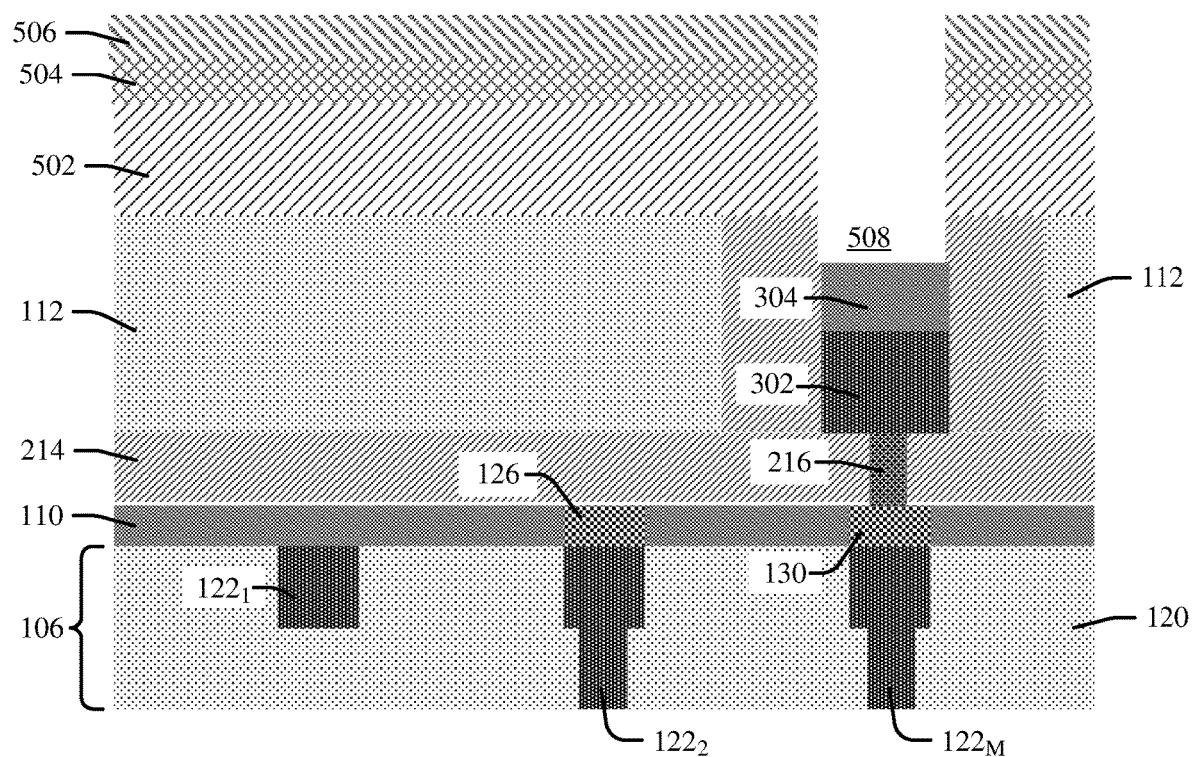
FIG. 5 further illustrates the example, non-limiting fabrication process associated with an intermediate structure in accordance with one or more embodiments described herein.

Referring to FIG. 5, the intermediate structure 501 can include the dual-damascene layer 106, the dielectric layer 110, the silicon nitride layer 214, the GST layer 302, the titanium nitride telluride layer 304, the oxide material 112, an organic planarization layer 502, a bottom anti-reflective coating (BARC) layer 504 and a photoresist layer 506, in accordance with one or more embodiments described herein. Repetitive description of like elements employed in other embodiments described herein is omitted for sake of brevity. In an aspect, the organic planarization layer 502 can be deposited on the oxide material 112 and a portion of the silicon nitride layer 214. The BARC layer 504 can be deposited on the organic planarization layer 502. Furthermore, the photoresist layer 506 can be deposited on the BARC layer 504. The organic planarization layer 502, the BARC layer 504 and/or the photoresist layer 506 can facilitate a lithography process to etch the silicon nitride layer 214 and expose the titanium nitride telluride layer 304. For example, a trench 508 associated with the titanium nitride telluride layer 304 can be created in the silicon nitride layer 214. The BARC layer 504 can be employed to control reflect and/or light absorption during the lithography process. The photoresist layer 506 can form a pattern coating associated with the trench 508 associated with the titanium nitride telluride layer 304.

Figure 6:
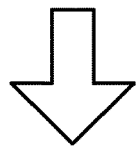
FIG. 6 further illustrates the example, non-limiting fabrication process associated with intermediate structures in accordance with one or more embodiments described herein.
Figure 6:
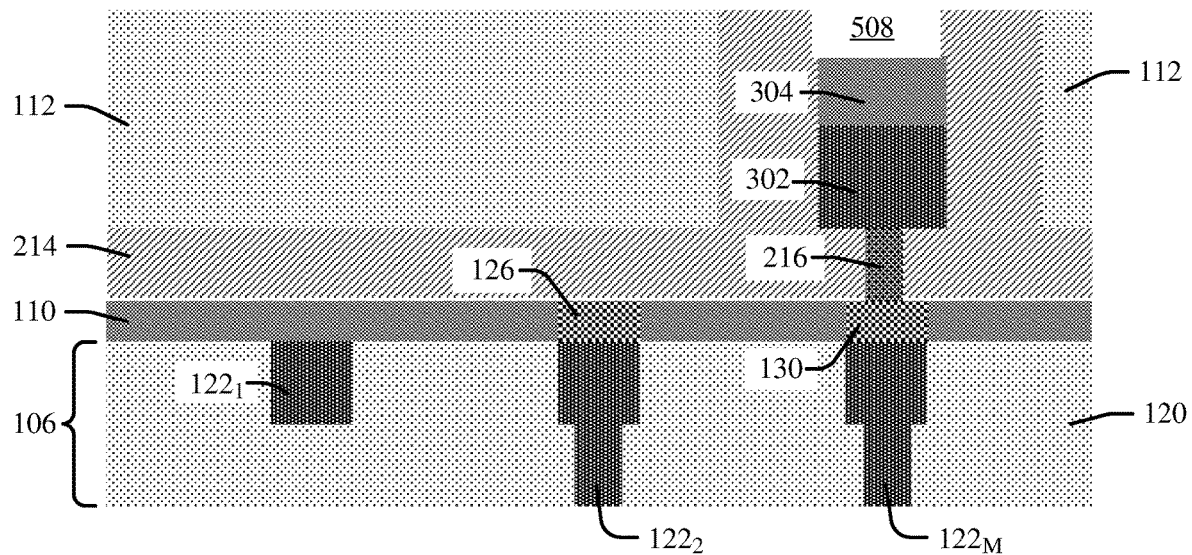
Figure 6:
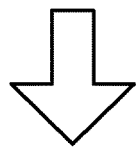
Figure 6:
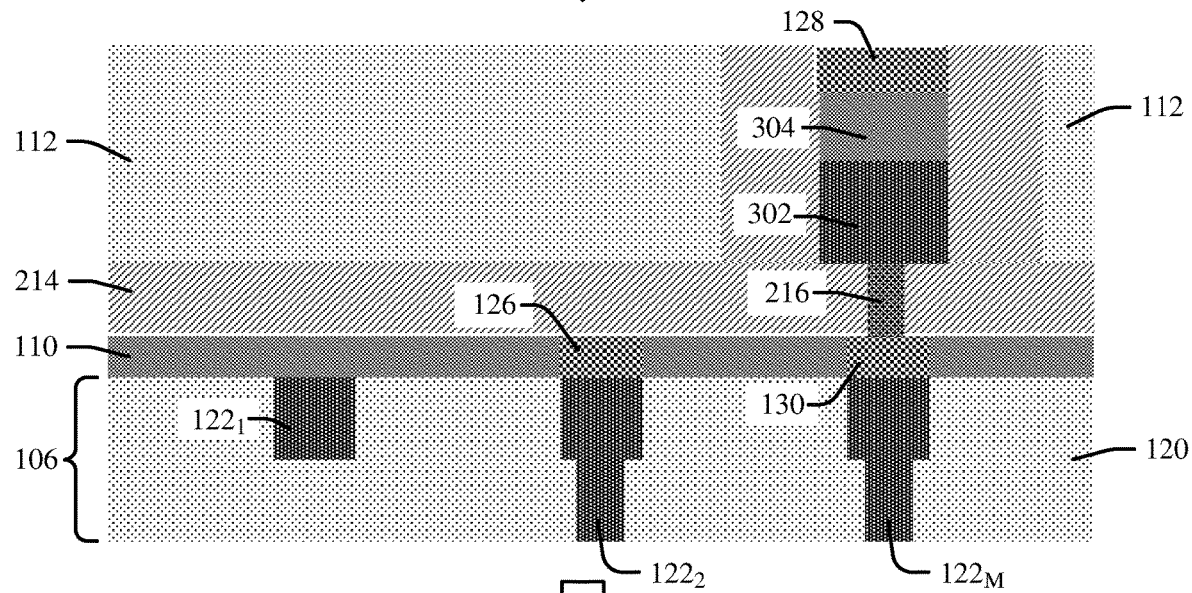
Figure 6:
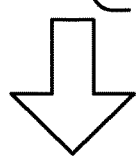

Referring to FIG. 6, the intermediate structure 602 can include the dual-damascene layer 106, the dielectric layer 110, the silicon nitride layer 214, the GST layer 302, the titanium nitride telluride layer 304 and the oxide material 112, in accordance with one or more embodiments described herein. Repetitive description of like elements employed in other embodiments described herein is omitted for sake of brevity. In an aspect, the organic planarization layer 502, the BARC layer 504 and/or the photoresist layer 506 can be removed. For example, a lithography stack associated with the organic planarization layer 502, the BARC layer 504 and/or the photoresist layer 506 can be removed. In another aspect, a size of the trench 508 can be reduced by removing the organic planarization layer 502, the BARC layer 504 and/or the photoresist layer 506.

Referring further to FIG. 6, the intermediate structure 612 can include the dual-damascene layer 106, the dielectric layer 110, the silicon nitride layer 214, the GST layer 302, the titanium nitride telluride layer 304, the oxide material 112 and the landing pad layer 128, in accordance with one or more embodiments described herein. Repetitive description of like elements employed in other embodiments described herein is omitted for sake of brevity. In an aspect, the landing pad layer 128 can be deposited in the trench 508. For example, the landing pad layer 128 can be deposited on the titanium nitride telluride layer 304 exposed during the lithography process. In an aspect, the landing pad layer 128 can be formed via a damascene deposit of tungsten, copper, titanium nitride or another metal. Furthermore, a chemical-mechanical planarization process can be performed to form the landing pad layer 128.

Figure 7:
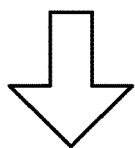
FIG. 7 further illustrates the example, non-limiting fabrication process associated with an intermediate structure in accordance with one or more embodiments described herein.
Figure 7:
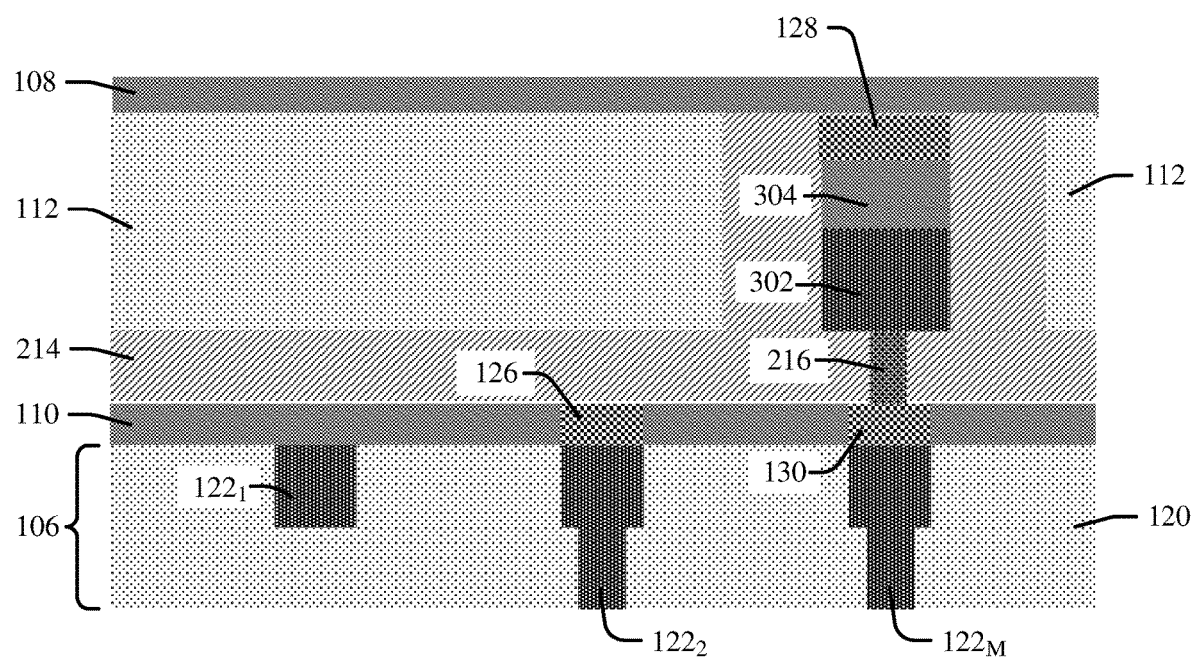
Figure 7:
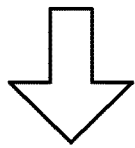

Referring to FIG. 7, the intermediate structure 702 can include the dual-damascene layer 106, the dielectric layer 110, the silicon nitride layer 214, the GST layer 302, the titanium nitride telluride layer 304, the oxide material 112, the landing pad layer 128 and the dielectric layer 108, in accordance with one or more embodiments described herein. Repetitive description of like elements employed in other embodiments described herein is omitted for sake of brevity. In an aspect, the dielectric layer 108 can be deposited on the oxide material 112 and the landing pad layer 128. The dielectric layer 108 can be, for example, a dielectric cap.

Figure 8:
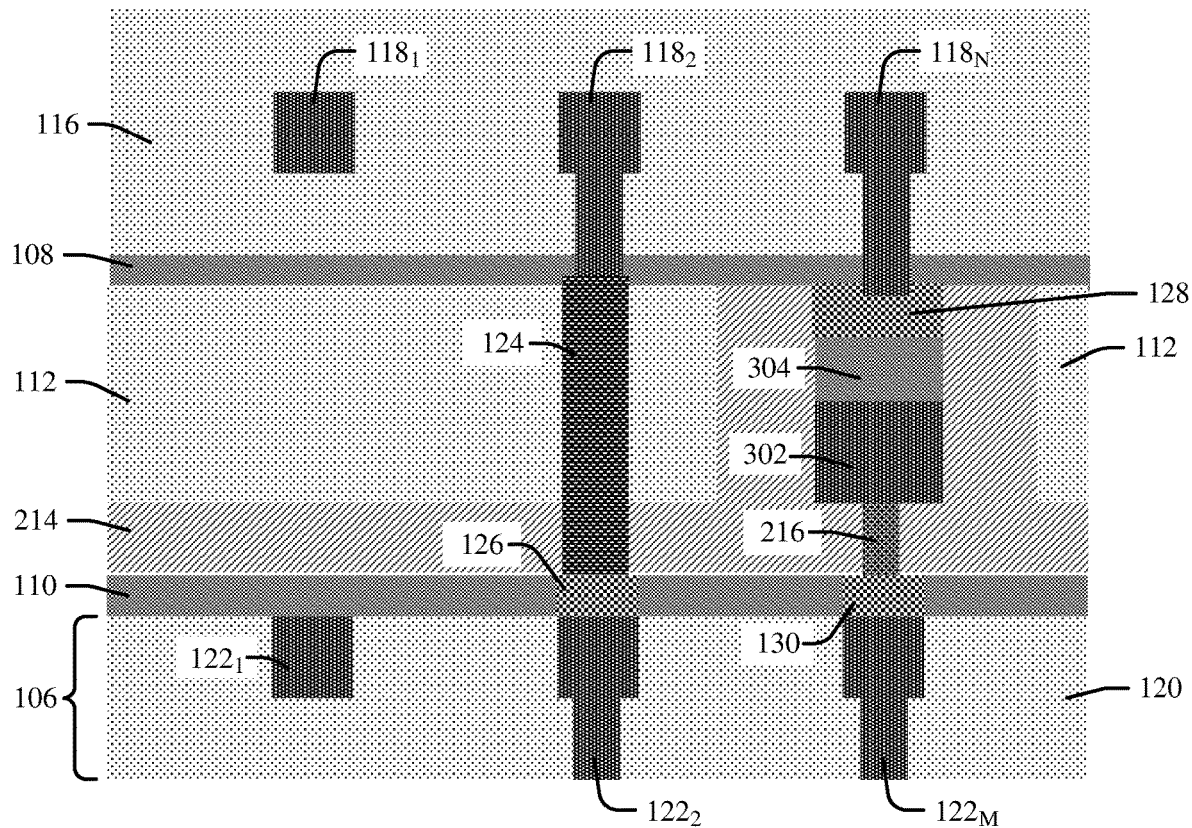
FIG. 8 further illustrates the example, non-limiting fabrication process associated with an intermediate structure in accordance with one or more embodiments described herein.

Referring to FIG. 8, the intermediate structure 802 can include the dual-damascene layer 106, the dielectric layer 110, the silicon nitride layer 214, the GST layer 302, the titanium nitride telluride layer 304, the oxide material 112, the landing pad layer 128, the dielectric layer 108 and the dielectric material 116, in accordance with one or more embodiments described herein. In an aspect, the dielectric material 116 can be deposited on the dielectric layer 108. In another aspect, the set of copper connections $118_{1-N}$ can be formed in the dielectric material 116. In yet another aspect, the TLV electrical connection 124 can be formed in the oxide material 112 and/or the silicon nitride layer 214. For example, the TLV electrical connection 124 can be attached to the copper connection $118_2$ and the copper connection $122_2$. In certain embodiments, the TLV electrical connection 124 can be attached to the copper connection $118_2$ and the landing pad layer 126 associated with the copper connection $122_2$.

Figure 9:
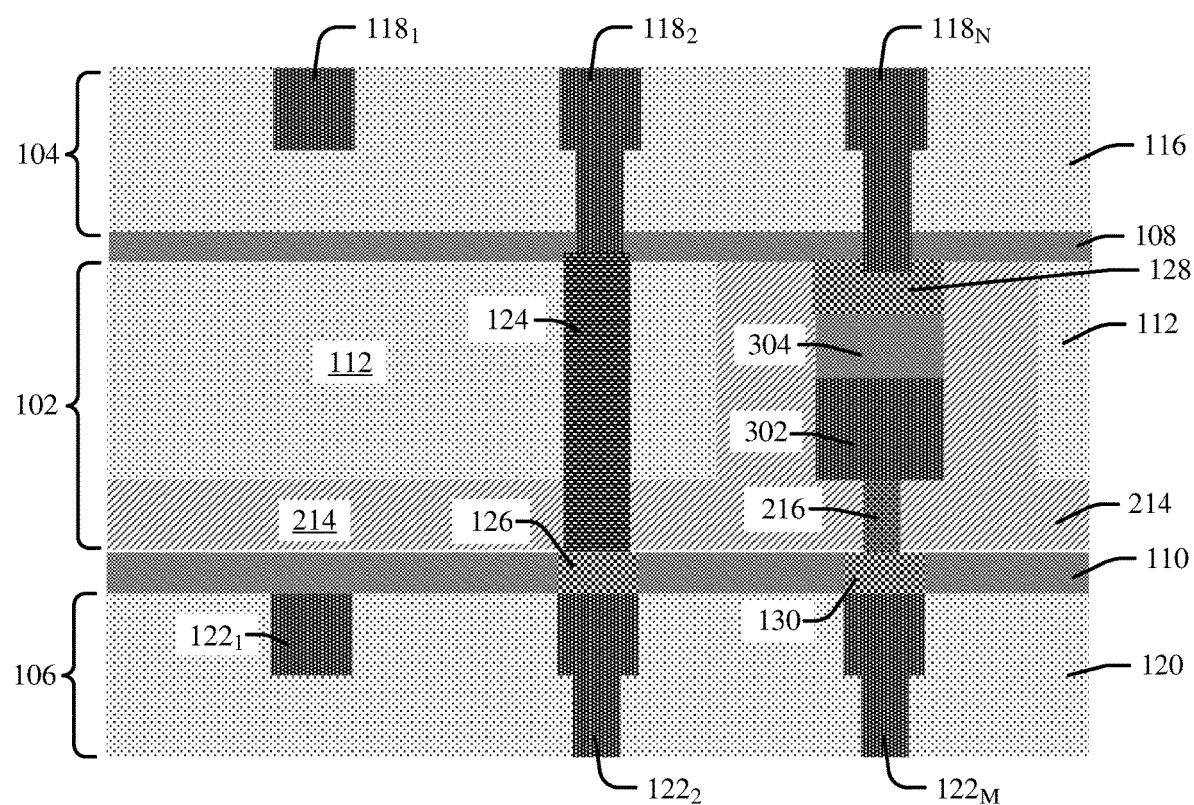
FIG. 9 further illustrates the example, non-limiting fabrication process associated with a structure in accordance with one or more embodiments described herein.

Referring to FIG. 9, the structure 902 can include the dual-damascene layer 106, the dielectric layer 110, the silicon nitride layer 214, the GST layer 302, the titanium nitride telluride layer 304, the oxide material 112, the landing pad layer 128, the dielectric layer 108 and the dielectric material 116, in accordance with one or more embodiments described herein. In an embodiment, the structure 902 can correspond to the device 100. In an aspect, a portion of the dielectric material 116 can be removed to expose a surface of the set of copper connections $118_{1-N}$ formed in the dielectric material 116. In an embodiment, the oxide material 112, the silicon nitride layer 214, the TLV electrical connection 124, the heater 216, the GST layer 302 and/or the titanium nitride telluride layer 304 can correspond to the artificial intelligence device layer 102. Furthermore, the dielectric material 116 and the set of copper connections $118_{1-N}$ can correspond to the dual-damascene layer 104. In certain embodiments, the heater 216, the GST layer 302, the titanium nitride telluride layer 304, and/or at least a portion of the silicon nitride layer 214 can correspond to an artificial intelligence device (e.g., the artificial intelligence device 114).

FIGS. 10-14 pictorially depict an example process 1000 for fabricating a device in accordance with one or more embodiments described herein. Repetitive description of like elements employed in other embodiments described herein is omitted for sake of brevity. With reference to FIGS. 10-14, presented is a cross-sectional side view of an intermediate structure 1002, an intermediate structure 1012, an intermediate structure 1101, an intermediate structure 1112, an intermediate structure 1202, an intermediate structure 1212, an intermediate structure 1302, and a structure 1402.

Figure 10:
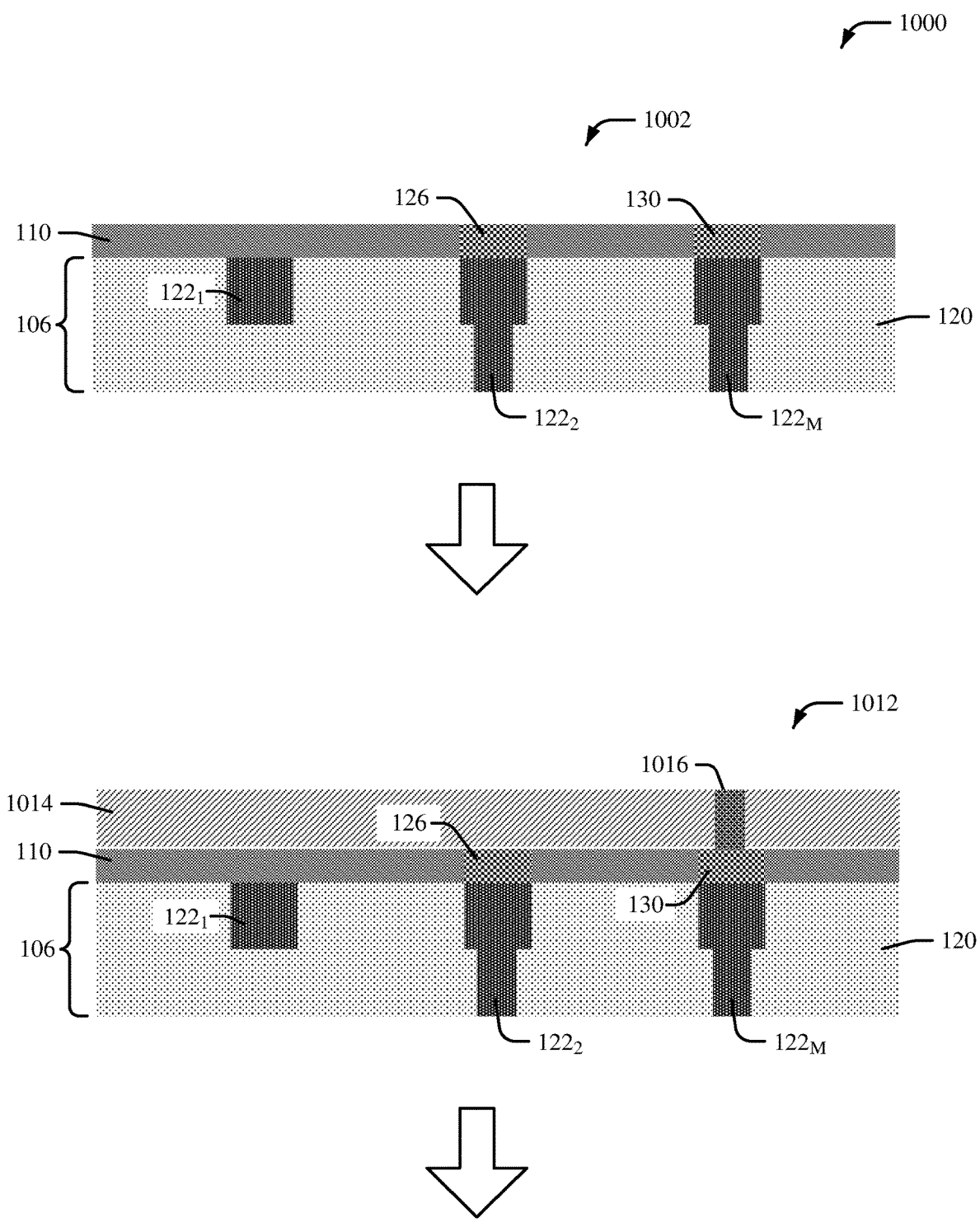
FIG. 10 illustrates another example, non-limiting fabrication process associated with intermediate structures in accordance with one or more embodiments described herein.

Referring to FIG. 10, the intermediate structure 1002 can include the dual-damascene layer 106 and the dielectric layer 110, in accordance with one or more embodiments described herein. Repetitive description of like elements employed in other embodiments described herein is omitted for sake of brevity. In an aspect, the set of copper connections $122_{1-M}$ can be formed in the dielectric material 120 of the dual-damascene layer 106. The set of copper connections $122_{1-M}$ can be, for example, a set of trenches in the dielectric material 120 filled with copper. For instance, a set of trenches corresponding to a location of the set of copper connections $122_{1-M}$ can be patterned in the dielectric material 120. Furthermore, the set of trenches can be filled with copper to form the set of copper connections $122_{1-M}$. Additionally, the landing pad layer 126 and/or the landing pad layer 130 can be deposited on at least a portion of the set of copper connections $122_{1-M}$. For instance, the landing pad layer 126 can be deposited on the copper connect $122_2$ and the landing pad layer 130 can be deposited on the copper connect $122_M$. In a non-limiting example, the landing pad layer 126 and/or the landing pad layer 130 can be a tungsten pad. However, it is to be appreciated that, in certain embodiments, the landing pad layer 126 and/or the landing pad layer 130 can be a different type of landing pad such as a copper pad, titanium nitride pad or another type of metal pad.

Referring further to FIG. 10, the intermediate structure 1012 can include the dual-damascene layer 106, the dielectric layer 110 and a silicon nitride layer 1014, in accordance with one or more embodiments described herein. Repetitive description of like elements employed in other embodiments described herein is omitted for sake of brevity. The silicon nitride layer 1014 can include silicon nitride. Furthermore, the silicon nitride layer 1014 can be deposited on the dielectric layer 110. In an aspect, a heater 1016 can be formed in the silicon nitride layer 1014. The heater 1016 can be attached, for example, to the landing pad layer 130. The heater 1016 can include, for example, titanium nitride and/or atomic layer deposited tantalum nitride. In a non-limiting example, a height of the heater 1016 can be approximately 55 nm.

Figure 11:
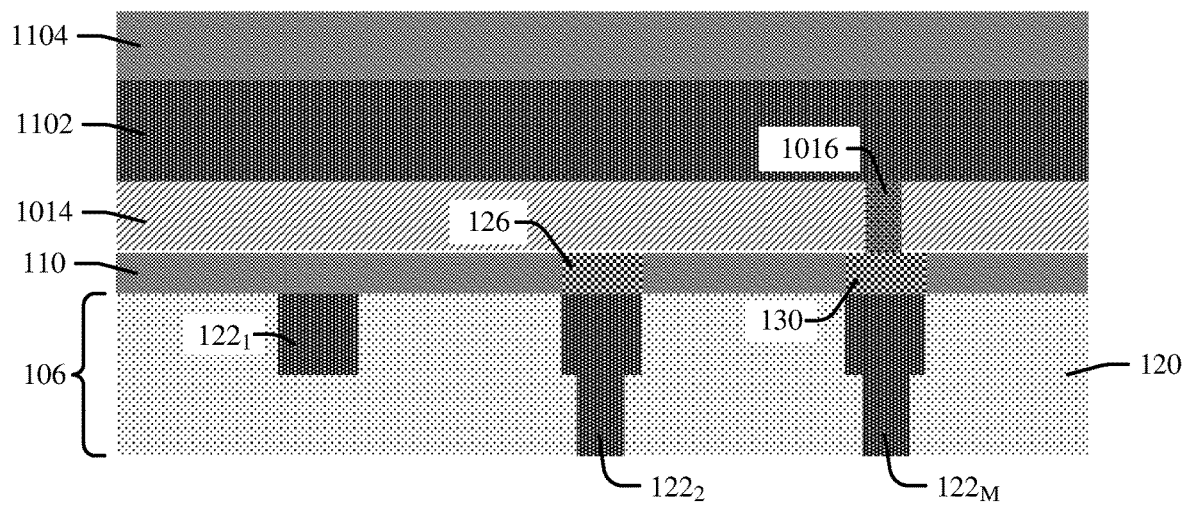
FIG. 11 further illustrates the other example, non-limiting fabrication process associated with intermediate structures in accordance with one or more embodiments described herein.
Figure 11:
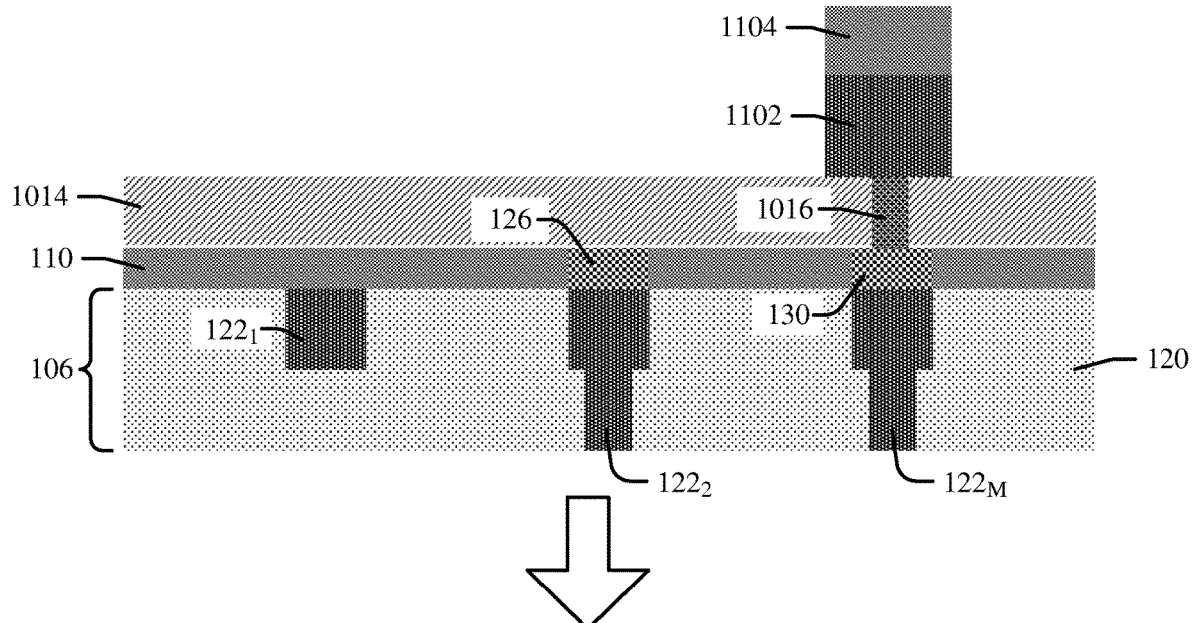

Referring to FIG. 11, the intermediate structure 1102 can include the dual-damascene layer 106, the dielectric layer 110, the silicon nitride layer 1014, a GST layer 1102 and a titanium nitride telluride layer 1104, in accordance with one or more embodiments described herein. Repetitive description of like elements employed in other embodiments described herein is omitted for sake of brevity. The GST layer 1102 can include germanium-antimony-tellurium and can be deposited on the silicon nitride layer 1014. The titanium nitride telluride layer 1104 can include titanium nitride telluride and can be deposited on the GST layer 1102. In a non-limiting example, a height of the GST layer 1102 can be between 50 nm and 90 nm. In another non-limiting example, a height of the titanium nitride telluride layer 1104 can be between 50 nm and 70 nm.

Referring further to FIG. 11, the intermediate structure 1112 can include the dual-damascene layer 106, the dielectric layer 110, the silicon nitride layer 1014, the GST layer 1102 and the titanium nitride telluride layer 1104, in accordance with one or more embodiments described herein. Repetitive description of like elements employed in other embodiments described herein is omitted for sake of brevity. The GST layer 1102 and the titanium nitride telluride layer 1104 can be etched to a smaller size. For example, a portion of the GST layer 1102 and the titanium nitride telluride layer 1104 can be etched. A size of the GST layer 1102 and the titanium nitride telluride layer 1104 can be approximately equal to a size of an area associated with the copper connection $122_M$. In an aspect, the GST layer 1102 can be attached to the heater 1016 and/or the silicon nitride layer 1014.

Figure 12:
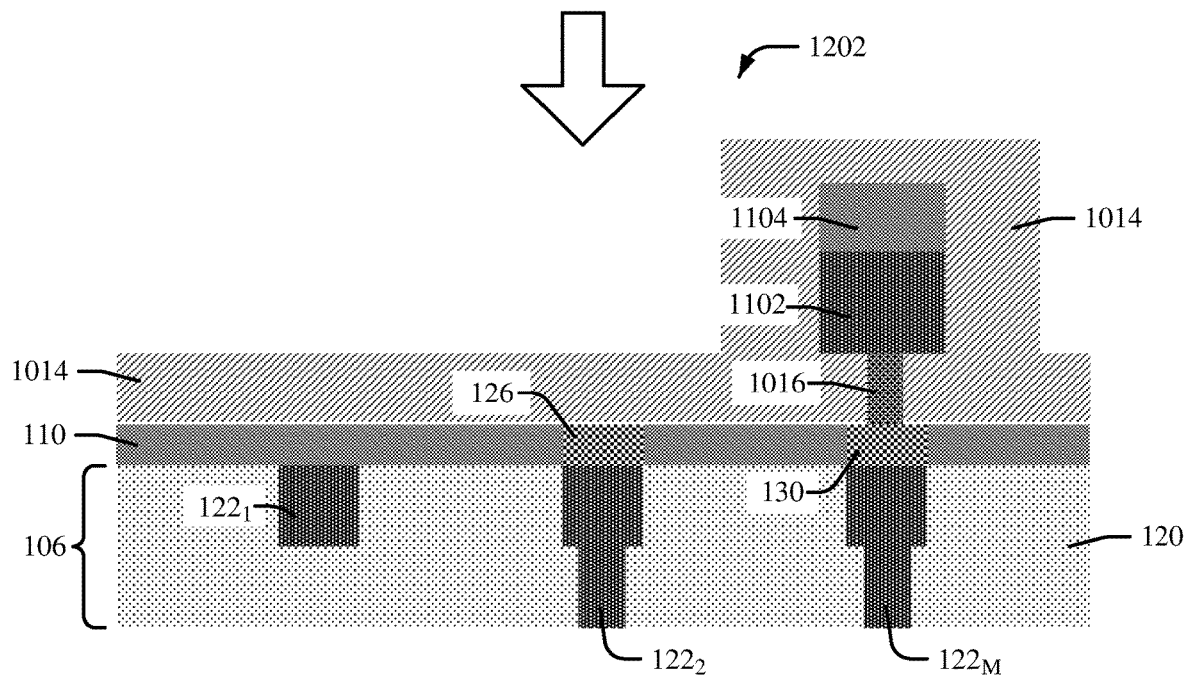
FIG. 12 further illustrates the other example, non-limiting fabrication process associated with intermediate structures in accordance with one or more embodiments described herein.
Figure 12:
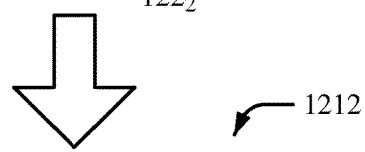
Figure 12:
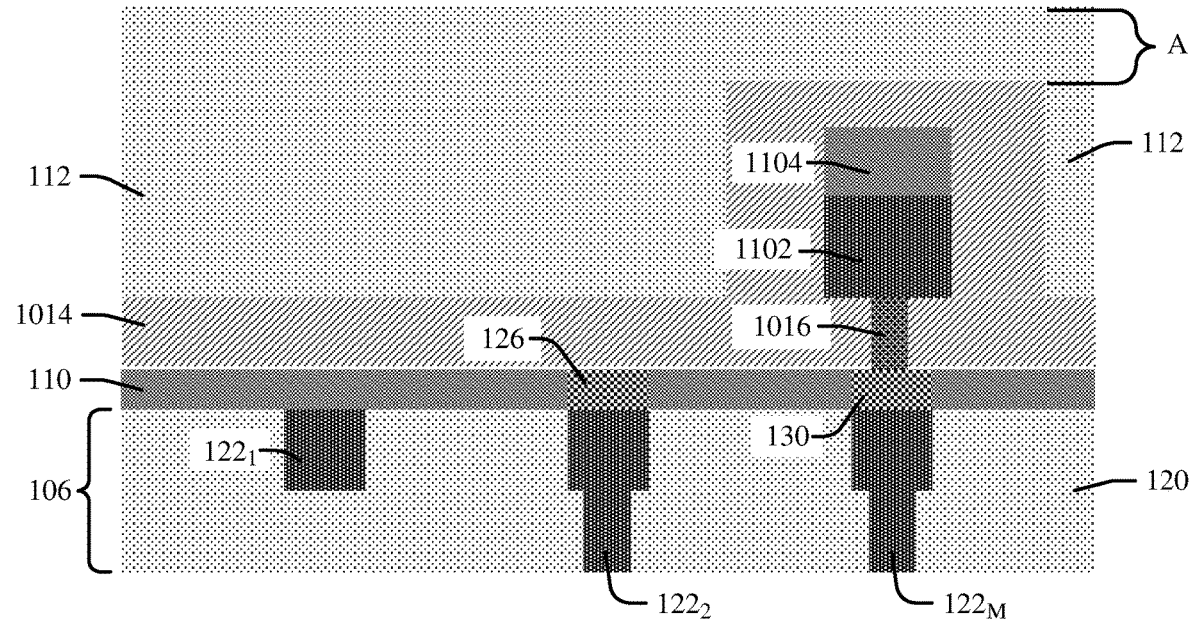
Figure 12:
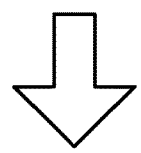

Referring now to FIG. 12, the intermediate structure 202 can include the dual-damascene layer 106, the dielectric layer 110, the silicon nitride layer 1014, the GST layer 1102 and the titanium nitride telluride layer 1104, in accordance with one or more embodiments described herein. Repetitive description of like elements employed in other embodiments described herein is omitted for sake of brevity. In an aspect, the silicon nitride layer 1014 can be further deposited to provide a silicon nitride cap around the GST layer 1102 and the titanium nitride telluride layer 1104. For example, the silicon nitride layer 1014 can be expanded such that the GST layer 1102 and the titanium nitride telluride layer 1104 is surrounded by the silicon nitride layer 1014.

Referring further to FIG. 12, the intermediate structure 1212 can include the dual-damascene layer 106, the dielectric layer 110, the silicon nitride layer 1014, the GST layer 1102, the titanium nitride telluride layer 1104 and the oxide material 112, in accordance with one or more embodiments described herein. Repetitive description of like elements employed in other embodiments described herein is omitted for sake of brevity. In an aspect, the oxide material 112 can be deposited on the silicon nitride layer 1014. In another aspect, the oxide material 112 can be deposited over a surface of the silicon nitride layer 1014 associated with the titanium nitride telluride layer 1104 by a certain distance A. For example, the distance A can be a distance between a surface of the oxide material 112 and a surface of the silicon nitride layer 1014 associated with the titanium nitride telluride layer 1104.

Figure 13:
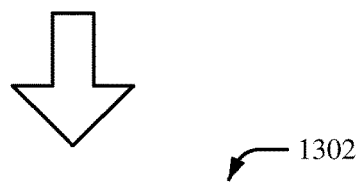
FIG. 13 further illustrates the other example, non-limiting fabrication process associated with an intermediate structure in accordance with one or more embodiments described herein.
Figure 13:
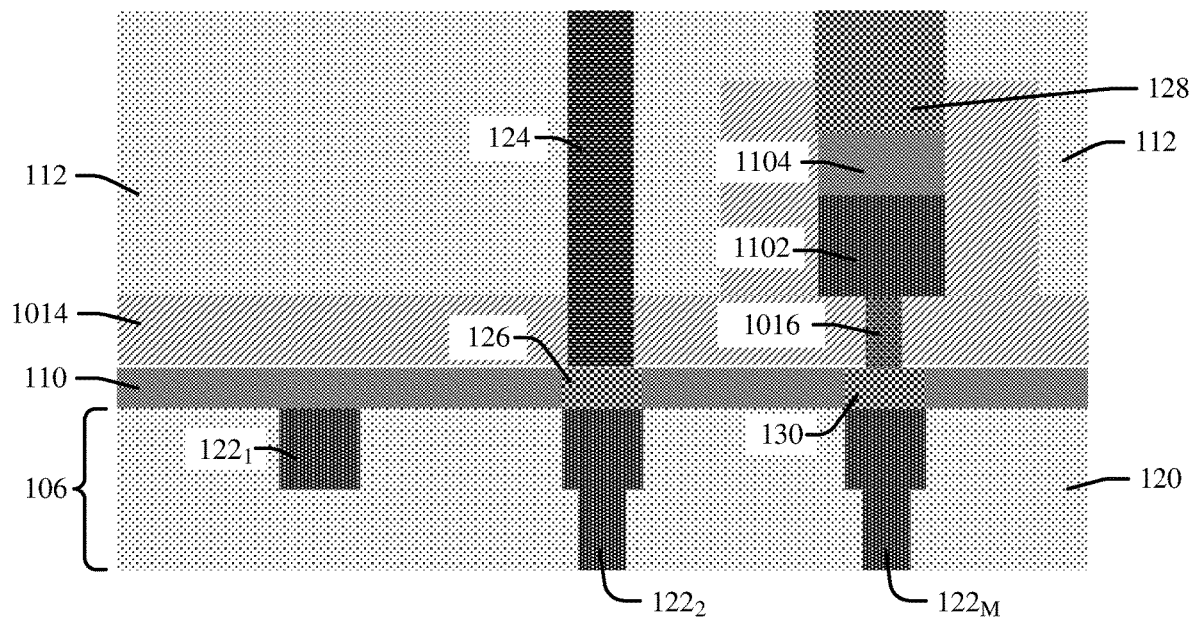
Figure 13:
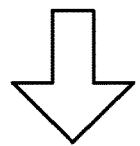

Referring to FIG. 13, the intermediate structure 1312 can include the dual-damascene layer 106, the dielectric layer 110, the silicon nitride layer 1014, the GST layer 1102, the titanium nitride telluride layer 1104, the oxide material 112 and the landing pad layer 128, in accordance with one or more embodiments described herein. Repetitive description of like elements employed in other embodiments described herein is omitted for sake of brevity. In an aspect, the landing pad layer 128 can be deposited on a surface of the titanium nitride telluride layer 1104. For example, the landing pad layer 128 can be deposited on the titanium nitride telluride layer 304 exposed during a lithography process. In an aspect, the landing pad layer 128 can be formed via a damascene deposit of tungsten, copper, titanium nitride or another metal. Furthermore, a chemical-mechanical planarization process can be performed to form the landing pad layer 128. In an embodiment, the landing pad layer 128 can within the silicon nitride layer 1014 and the oxide material 112. For example, approximately 200 nm of the landing pad layer 128 can be within the oxide material 112. In another aspect, the TLV electrical connection 124 can be formed in the oxide material 112 and/or the silicon nitride layer 1014. For example, the TLV electrical connection 124 can be attached to the landing pad layer 126.

Figure 14:
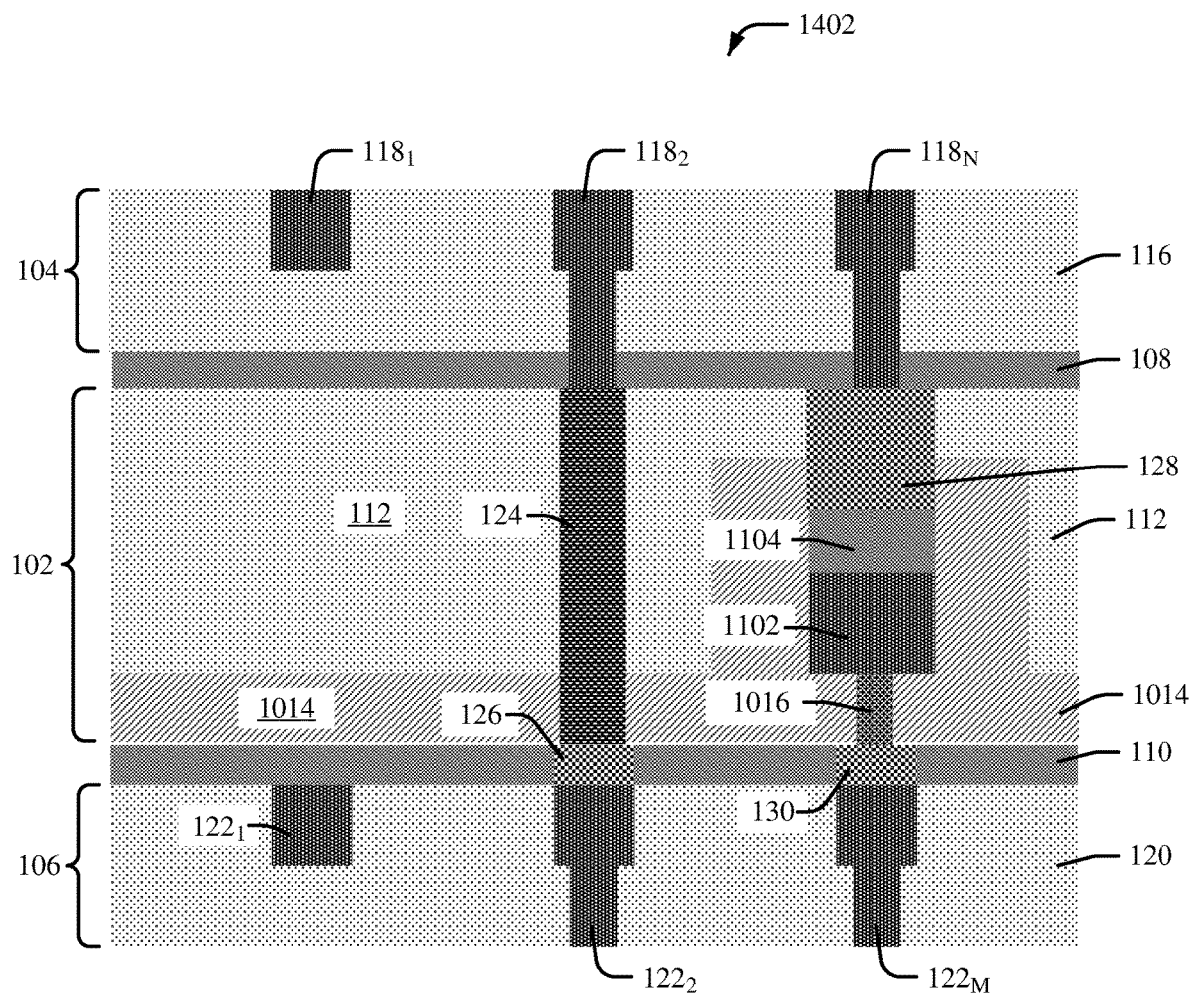
FIG. 14 further illustrates the other example, non-limiting fabrication process associated with a structure in accordance with one or more embodiments described herein.

Referring to FIG. 14, the structure 1402 can include the dual-damascene layer 106, the dielectric layer 110, the silicon nitride layer 1014, the GST layer 1102, the titanium nitride telluride layer 1104, the oxide material 112, the landing pad layer 128, the dielectric layer 108 and the dielectric material 116, in accordance with one or more embodiments described herein. In an embodiment, the structure 1402 can correspond to the device 100. In an embodiment, the oxide material 112, the silicon nitride layer 1014, the TLV electrical connection 124, the heater 1016, the GST layer 1102 and/or the titanium nitride telluride layer 1104 can correspond to the artificial intelligence device layer 102. Furthermore, the dielectric material 116 and the set of copper connections $118_{1-N}$ can correspond to the dual-damascene layer 104. In certain embodiments, the heater 1016, the GST layer 1102, the titanium nitride telluride layer 1104, and/or at least a portion of the silicon nitride layer 1014 can correspond to an artificial intelligence device (e.g., the artificial intelligence device 114).

Figure 15:
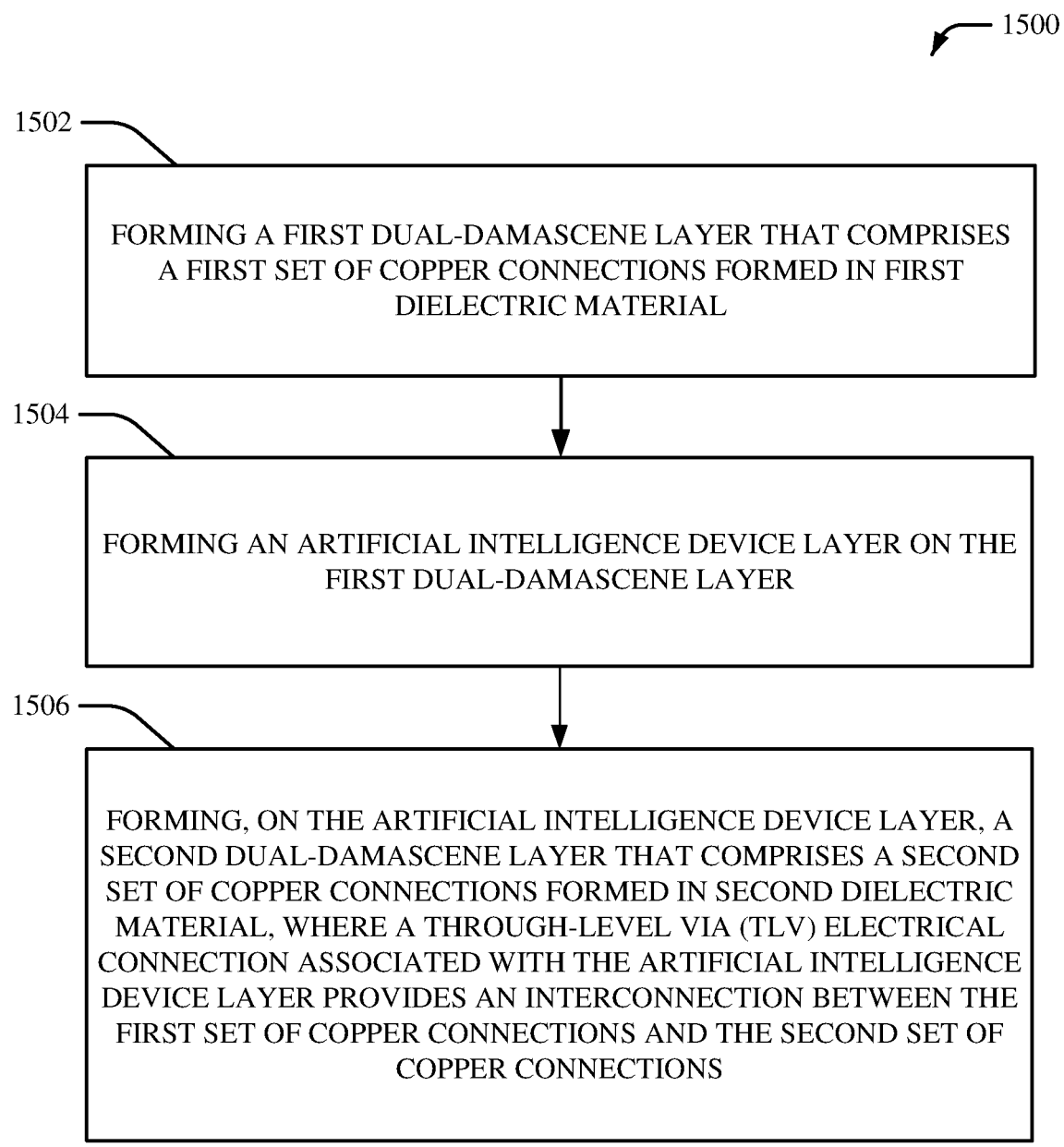
FIG. 15 illustrates a flow diagram of an example, non-limiting method for facilitating integration of artificial intelligence devices in accordance with one or more embodiments described herein.

FIG. 15 illustrates a flow diagram of an example, non-limiting method 1500 for facilitating integration of artificial intelligence devices in accordance with one or more embodiments described herein. Repetitive description of like elements employed in other embodiments described herein is omitted for sake of brevity.

At 1502, a first dual-damascene layer that comprises a first set of copper connections formed in first dielectric material is formed. The first set of copper connections can be a set of trenches in the first dielectric material filled with copper. The first dielectric material can be, for example, a dielectric material that is an electrical insulator. In an embodiment, a size of a first copper connection from the first set of copper connections can be different than a size of a second copper connection from the first set of copper connections. Additionally or alternatively, a size of a first copper connection from the first set of copper connections can correspond to a size of a second copper connection from the first set of copper connections.

At 1504, an artificial intelligence device layer is formed on the first dual-damascene layer. For example, the artificial intelligence device layer can be deposited on the first dual-damascene layer. The artificial intelligence device layer can include at least oxide material and an artificial intelligence device. The artificial intelligence device can be, for example, an artificial intelligence memory device. For example, the artificial intelligence device can be a resistive random-access memory device, a magnetoresistive random-access memory device, a phase-change memory device, or another memory device.

At 1506, a second dual-damascene layer that comprises a second set of copper connections formed in second dielectric material is formed on the artificial intelligence device layer, where a through-level via (TLV) electrical connection associated with the artificial intelligence device layer provides an interconnection between the first set of copper connections and the second set of copper connections. For example, the TLV electrical connection can be included in the artificial intelligence device layer and can provide an electrical connection between at least one copper connection of the first set of copper connections and at least one copper connection of the second set of copper connections. The TLV electrical connection can include tungsten, copper, titanium nitride or another metal. The second set of copper connections can be a set of trenches in the second dielectric material filled with copper. The second dielectric material can be, for example, a dielectric material that is an electrical insulator. In an embodiment, a size of a first copper connection from the second set of copper connections can be different than a size of a second copper connection from the second set of copper connections. Additionally or alternatively, a size of a first copper connection from the second set of copper connections can correspond to a size of a second copper connection from the second set of copper connections. In an embodiment, the second dual-damascene layer can be formed on the artificial intelligence device layer to reduce access time to store data to an artificial intelligence memory device associated with the artificial intelligence device layer.

In certain embodiments, the method 1500 can additionally or alternatively include bonding an artificial intelligence memory device associated with the artificial intelligence device layer to the first set of copper connections and the second set of copper connections. In certain embodiments, the method 1500 can additionally or alternatively include bonding an artificial intelligence memory device associated with the artificial intelligence device layer to a landing pad layer and the second set of copper connections. In certain embodiments, the method 1500 can additionally or alternatively include bonding an artificial intelligence memory device associated with the artificial intelligence device layer to a landing pad layer and the first set of copper connections. In certain embodiments, the method 1500 can additionally or alternatively include bonding the TLV electrical connection associated with the artificial intelligence device layer to a landing pad layer and the second set of copper connections. In certain embodiments, the method 1500 can additionally or alternatively include depositing a dielectric layer between the artificial intelligence device layer and the first dual-damascene layer. In certain embodiments, the method 1500 can additionally or alternatively include depositing a dielectric layer between the artificial intelligence device layer and the second dual-damascene layer.

For simplicity of explanation, the methodology is depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodology in accordance with the disclosed subject matter. In addition, those skilled in the art will understand and appreciate that the methodology could alternatively be represented as a series of interrelated states via a state diagram or events. The flowchart and block diagrams in the Figures illustrate the architecture, functionality, and operation of possible implementations of systems, methods, apparatuses and devices according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "electronic device" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, an electronic device and/or a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, electronic devices and/or processors can exploit nano-scale architectures such as, but not limited to, molecular and quantum-dot based transistors, switches and gates, in order to optimize space usage or enhance performance of user equipment. An electronic device and/or a processor can also be implemented as a combination of computing processing units.

What has been described above include mere examples of systems and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a first dual-damascene layer that comprises a first set of copper connections formed in first dielectric material;
    a second dual-damascene layer that comprises a second set of copper connections formed in second dielectric material;
    an artificial intelligence memory device integrated between the first dual-damascene layer and the second dual-damascene layer and disposed in an artificial intelligence device layer comprising oxide and the artificial intelligence memory device; and
    a through-level via (TLV) electrical connection disposed in the artificial intelligence device layer and a first end of the TLV electrical connection being directly connected to the first set of copper connections and a second end of the TLV electrical connection being directly connected to a first landing pad layer within a dielectric layer abutting the second dielectric material, wherein the TLV electrical connection is associated with the artificial intelligence memory device and provides an interconnection between the first set of copper connections and the second set of copper connections.

2. The device of claim 1, wherein the artificial intelligence memory device is a resistive random-access memory device, a magnetoresistive random-access memory device, a phase-change memory device, or another memory device.

3. The device of claim 1, wherein the TLV electrical connection comprises tungsten, copper, titanium nitride or another metal.

4. The device of claim 1, further comprising:
    a second landing pad layer integrated between the artificial intelligence memory device and the first set of copper connections associated with the first dual-damascene layer.

5. The device of claim 4, wherein the second landing pad layer is a first material that is different than a second material of the TLV electrical connection.

6. The device of claim 4, wherein the second landing pad layer comprises tungsten, copper, titanium nitride or another metal.

7. The device of claim 1, further comprising:
    a third landing pad layer integrated between the artificial intelligence memory device and the second set of copper connections associated with the second dual-damascene layer.

8. The device of claim 7, wherein the third landing pad layer is a first material that is different than a second material of the TLV electrical connection.

9. The device of claim 7, wherein the third landing pad layer comprises tungsten, copper, titanium nitride or another metal.

10. The device of claim 1, wherein the artificial intelligence memory device is integrated between the first dual-damascene layer and the second dual-damascene layer to reduce access time to store data to the artificial intelligence memory device.

11. The device of claim 1, wherein the artificial intelligence memory device has a first end that is directly connected to a second landing pad layer and has a second end that is directly connected to a second landing pad layer, wherein the second landing pad layer is disposed in the second dielectric material and the second landing pad layer is directed connected to the first set of copper connections.

12. A device, comprising:
    a first dual-damascene layer that comprises a first set of copper connections formed in first dielectric material;

a second dual-damascene layer that comprises a second set of copper connections formed in second dielectric material; and an artificial intelligence device layer integrated between the first dual-damascene layer and the second dual-damascene layer, wherein the artificial intelligence device layer comprises an artificial intelligence memory device and a through-level via (TLV) electrical connection that provides an interconnection between the first set of copper connections and the second set of copper connections, and wherein the artificial intelligence memory device comprises a heater, a germanium-antimony-tellurium layer, and a titanium nitride telluride layer.

13. The device of claim 12, wherein the TLV electrical connection comprises tungsten, copper, titanium nitride or another metal.

\* \* \* \* \*